(12) United States Patent
Park

(10) Patent No.: US 11,275,469 B1
(45) Date of Patent: Mar. 15, 2022

(54) DISPLAY DEVICE

(71) Applicant: Samsung Display Co., LTD., Yongin-si (KR)

(72) Inventor: Seong-Sik Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/332,961

(22) Filed: May 27, 2021

(30) Foreign Application Priority Data

Sep. 14, 2020 (KR) .................. 10-2020-0117615

(51) Int. Cl.
*G06F 3/038* (2013.01)
*G06F 3/041* (2006.01)
(Continued)

(52) U.S. Cl.
CPC ............ *G06F 3/0418* (2013.01); *G06F 3/046* (2013.01); *G06F 3/047* (2013.01); *G06F 3/04164* (2019.05); *G06K 9/00013* (2013.01); *H04M 1/0266* (2013.01); *H05K 1/118* (2013.01); *H04M 2201/38* (2013.01); *H05K 2201/09027* (2013.01); *H05K 2201/09236* (2013.01);
(Continued)

(58) Field of Classification Search
CPC .... G06F 3/0418; G06F 3/04164; G06F 3/046; G06F 3/047; G06F 3/038; G06F 3/041; G06F 3/045; G06K 9/00013; H04M 1/0266; G09G 5/00; G09G 3/32; G09G 3/3225; G09G 3/3266; G09G 3/3275; G09G 2300/0426; G09G 2320/0626; G09G 3/035; G09G 2330/021; G09G 3/30; G09G 3/34; G09G 3/36; H01L 27/3262; H01L 27/3265; H01L 27/3276; H01L 27/1225; H01L 27/124; H01L 27/32; H01L 29/78675; H01L 27/3279; H01L 2251/5338
See application file for complete search history.

(56) References Cited

U.S. PATENT DOCUMENTS 7,078,726 B2 7/2006 Pichler et al.
9,582,090 B2 2/2017 Li et al.
(Continued)

FOREIGN PATENT DOCUMENTS

CN 1849717 10/2006
CN 208156943 11/2018
(Continued)

*Primary Examiner* — Pegeman Karimi
(74) *Attorney, Agent, or Firm* — Lewis Roca Rothgerber Christie LLP

(57) ABSTRACT

A display device may include a display panel including a display area and a non-display area in a periphery of the display area, a digitizer under the display panel, the digitizer having a first opening, a first wiring extending in a first direction and disconnected at the first opening, and a second wiring extending in a second direction crossing the first direction and disconnected at the first opening, a sensor under the display panel and in the first opening, and a first flexible circuit board under the sensor, the first flexible circuit board including a long side extending in the second direction, a short side crossing the long side, a first connection pad on the long side and electrically coupled to the first wiring, and a second connection pad on the long side and electrically coupled to the second wiring.

20 Claims, 8 Drawing Sheets

(51) Int. Cl.
    *H05K 1/11*         (2006.01)
    *G06K 9/00*        (2022.01)
    *G06F 3/047*      (2006.01)
    *H04M 1/02*      (2006.01)
    *G06F 3/046*      (2006.01)

(52) U.S. Cl.
    CPC .............. *H05K 2201/09245* (2013.01); *H05K 2201/09409* (2013.01)

(56) References Cited

U.S. PATENT DOCUMENTS

| | | | |
|---|---|---|---|
| 10,824,261 B1* | 11/2020 | Gong | G09G 3/20 |
| 2012/0299850 A1* | 11/2012 | Lee | G06F 3/046 |
| | | | 345/173 |
| 2015/0199038 A1* | 7/2015 | Li | G06F 1/1643 |
| | | | 345/173 |
| 2018/0074631 A1* | 3/2018 | Hashida | B32B 15/04 |
| 2019/0163003 A1* | 5/2019 | Kim | G02F 1/1333 |

FOREIGN PATENT DOCUMENTS

| | | |
|---|---|---|
| EP | 3003672 | 8/2017 |
| KR | 10-2018-0127705 | 11/2018 |

* cited by examiner

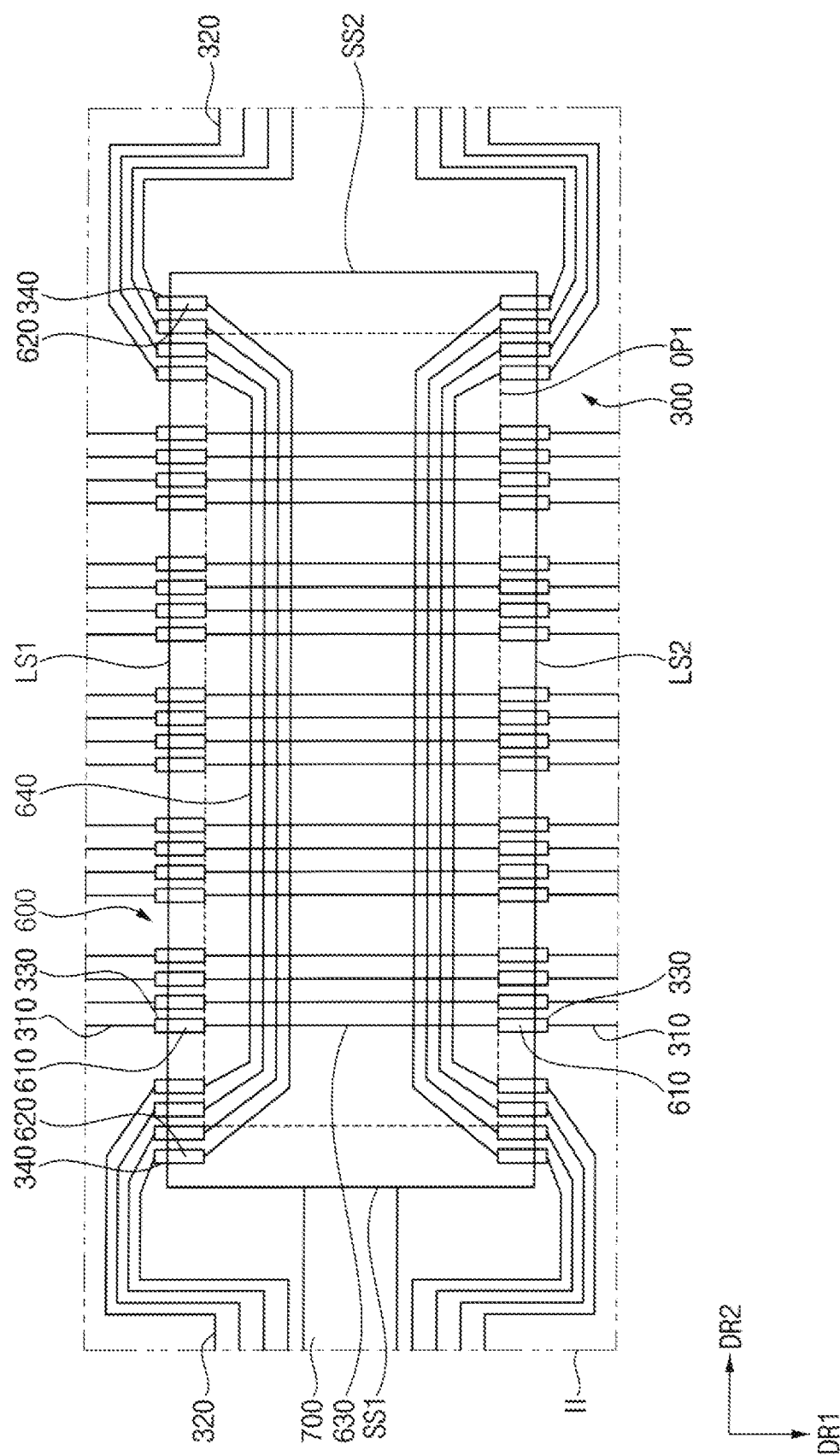

DISPLAY DEVICE

CROSS-REFERENCE TO RELATED APPLICATION(S)

This application claims priority to and the benefit of Korean Patent Application No. 10-2020-0117615, filed on Sep. 14, 2020, the entire disclosure of which is hereby incorporated by reference.

BACKGROUND

1. Field

Embodiments relate to a display device.

2. Description of the Related Art

A display device is a device for presenting information in a visual form. The display device is utilized (e.g., used) in a variety of suitable devices such as smartphones, etc. The display device may include at least one of a touch sensing layer for sensing a touch by a user or a digitizer for sensing a touch by a stylus pen as an input device. As the display device has various suitable functions, the display device may also include a sensor such as a fingerprint recognition sensor, an iris recognition sensor, a proximity sensor, etc.

The digitizer may be applied to a display device in various suitable methods, such as an electromagnetic resonance (EMR) method, a pressure sensitive method, a capacitance method, etc. In the case of the electromagnetic resonance method, because the position information is recognized by the electromagnetic resonance between the stylus pen and an electrode pattern of the digitizer regardless of the touch by the hand of the user, the user may utilize (e.g., use) the display device more comfortably.

The sensor may be an infrared optical sensor. The infrared optical sensor may include a light-emitting part that emits infrared rays and a sensor that receives the infrared rays. The infrared optical sensor may perform a sensing function by measuring the time that it takes for the emitted infrared rays to be reflected and received by the sensor.

The digitizer and the sensor may be disposed behind a display panel included in the display device. Accordingly, an opening may be formed in a part of the digitizer, and the sensor may be disposed in the opening. To connect wirings of the digitizer that are disconnected by the opening, the display device may include a printed circuit board disposed on the opening and covering the sensor.

SUMMARY

Aspects of embodiments of the present disclosure are directed towards a display device that prevents or reduces misalignment between a digitizer and a flexible circuit board (e.g., a first flexible circuit board).

Aspects of embodiments of the present disclosure are directed towards a display device that prevents or reduces interference between a first flexible circuit board and a second flexible circuit board coupled (e.g., connected) to a sensor.

A display device according to an embodiment may include a display panel including a display area and a non-display area in a periphery of the display area, a digitizer under the display panel, the digitizer having a first opening and including a first wiring extending in a first direction and disconnected at (e.g., by) the first opening and a second wiring extending in a second direction crossing the first direction and disconnected at (e.g., by) the first opening, a sensor under the display panel and in the first opening, and a first flexible circuit board under the sensor, the first flexible circuit board including a long side extending in the second direction, a short side crossing the long side, a first connection pad on the long side and electrically coupled (e.g., connected) to the first wiring, and a second connection pad on the long side and electrically coupled (e.g., connected) to the second wiring.

In an embodiment, the first flexible circuit board may further include a protruding portion between the long side and the short side and extending in the second direction.

In an embodiment, the second connection pad may be on the long side at (e.g., in) the protruding portion.

In an embodiment, the display device may further include a second flexible circuit board coupled (e.g., connected) to the sensor and overlapping the short side.

In an embodiment, the second flexible circuit board may be spaced apart from the protruding portion in the first direction.

In an embodiment, the short side may extend in the first direction.

In an embodiment, the second connection pad may be closer to a corner of the first flexible circuit board in which the long side contacts the short side than the first connection pad is to the corner.

In an embodiment, the first opening may be in the display area in a plan view.

In an embodiment, the sensor may be a fingerprint recognition sensor.

In an embodiment, the display device may further include a cushion layer between the display panel and the digitizer and having a second opening overlapping the first opening.

A display device according to an embodiment may include a display panel including a display area and a non-display area in a periphery of the display area, a digitizer under the display panel, the digitizer having an opening in the display area in a plan view and including a first wiring extending in a first direction and disconnected at (e.g., by) the opening, and a second wiring extending in a second direction crossing the first direction and disconnected at (e.g., by) the opening, a sensor under the display panel and in the opening, and a first flexible circuit board under the sensor, the first flexible circuit board including a first long side extending in the second direction, a second long side parallel (e.g., substantially parallel) to the first long side, a short side coupling (e.g., connecting) the first long side and the second long side, a pair of first connection pads respectively on the first long side and the second long side and electrically coupled (e.g., connected) to the first wiring, and a pair of second connection pads on the first long side and electrically coupled (e.g., connected) to the second wiring.

In an embodiment, a first connection pad on the first long side among the pair of first connection pads may be between the pair of second connection pads.

In an embodiment, the first flexible circuit board may further include a first connection wiring coupling (e.g., connecting) the pair of first connection pads and a second connection wiring insulated from the first connection wiring and coupling (e.g., connecting) the pair of second connection pads.

In an embodiment, the first connection wiring may extend in the first direction.

In an embodiment, the second connection wiring may be bent at least once in the plan view.

In an embodiment, the first long side may be greater than the second long side in length.

In an embodiment, the first long side may be substantially equal to the second long side in length.

In an embodiment, the display device may further include a second flexible circuit board coupled (e.g., connected) to the sensor and overlapping the short side.

A display device according to an embodiment may include a display panel including a display area and a non-display area in a periphery of the display area, a digitizer under the display panel, the digitizer having an opening in the display area in a plan view and including a plurality of first wirings extending in a first direction and disconnected at (e.g., by) the opening and a plurality of second wirings extending in a second direction crossing the first direction and disconnected at (e.g., by) the opening, a sensor under the display panel and in the opening, and a flexible circuit board under the sensor, the flexible circuit board including a first long side extending in the second direction, a second long side parallel (e.g., substantially parallel) to the first long side, a short side coupling (e.g., connecting) the first long side and the second long side, a plurality of first connection pads on the first long side and the second long side and electrically coupled (e.g., connected) to the first wirings, and a plurality of second connection pads on at least one selected from the first long side and the second long side and electrically coupled (e.g., connected) to the second wirings.

In an embodiment, the second connection pads may be on the first long side and the second long side.

In the display device according to the embodiments, the first connection pads and the second connection pads of the first flexible circuit board respectively electrically coupled (e.g., connected) to the first wirings and the second wirings of the digitizer may be disposed only on the long side(s) of the first flexible circuit board, so that misalignment between the digitizer and the first flexible circuit board may be prevented or reduced.

In the display device according to some embodiments, the first connection pads and the second connection pads of the first flexible circuit board are not disposed on the short side of the first flexible circuit board, so that interference between the first flexible circuit board and the second flexible circuit board coupled (e.g., connected) to the sensor may be prevented or reduced.

BRIEF DESCRIPTION OF THE DRAWINGS

Illustrative, non-limiting embodiments will be more clearly understood from the following detailed description taken in conjunction with the accompanying drawings.

FIG. 8 is a plan view illustrating an example of the area II in FIG. 2 according to an embodiment.

DETAILED DESCRIPTION

Hereinafter, backlight units and display devices in accordance with embodiments will be explained in more detail with reference to the accompanying drawings.

As used herein, the use of the term "may," when describing embodiments of the present disclosure, refers to "one or more embodiments of the present disclosure." As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. As used herein, the singular forms "a", "an" and "the" are intended to include the plural forms as well, unless the context clearly indicates otherwise. Expressions such as "selected from" when preceding a list of elements, modify the entire list of elements and do not modify the individual elements of the list. Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Figure 1:
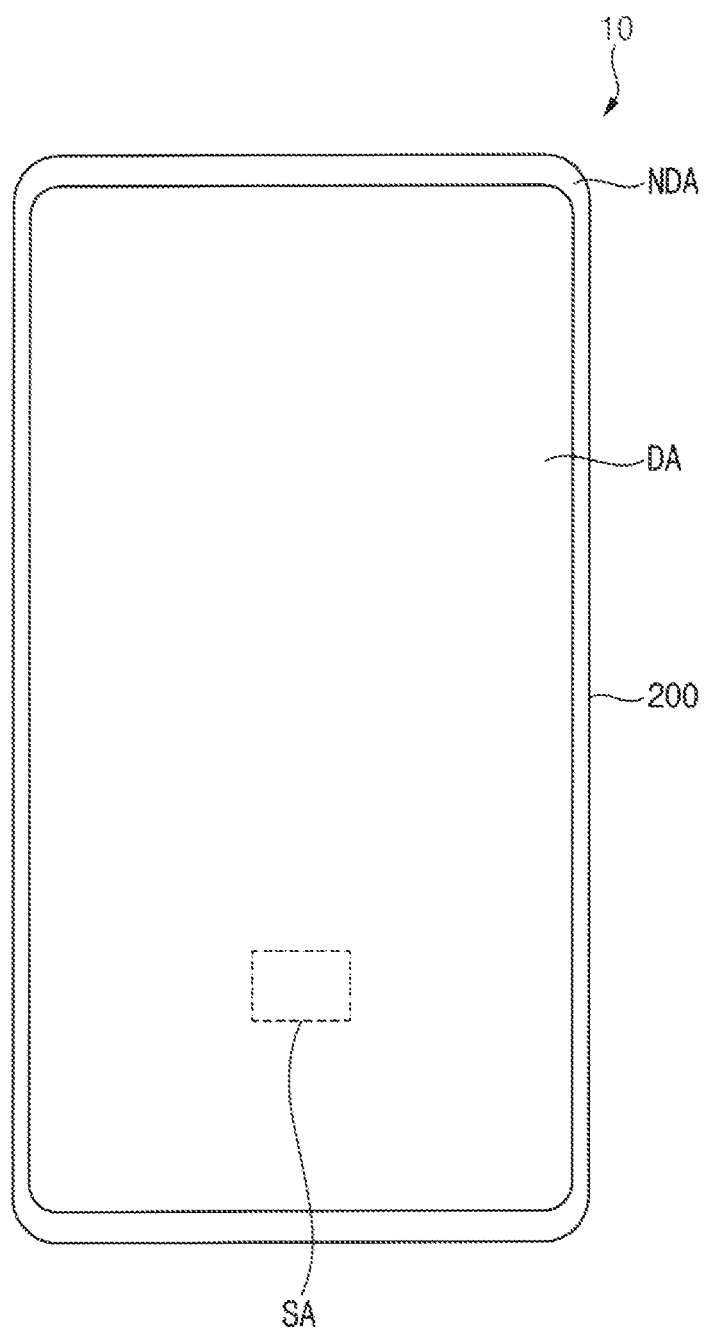
FIG. 1 is a front view illustrating a display device according to an embodiment.

FIG. 1 is a front view illustrating a display device 10 according to an embodiment.

Referring to FIG. 1, the display device 10 may include a display area DA and a non-display area NDA. The display area DA may be an area that displays an image (e.g., an area where an image is to be displayed). A planar shape of the display area DA may be a rectangular shape or a rectangular shape in which a corner is rounded, as illustrated in FIG. 1. However, the planar shape of the display area DA is not limited thereto. For example, the display area DA may have various suitable planar shapes such as a circular shape, an oval shape, a polygonal shape, or the like.

The display area DA may include a sensing area SA positioned in the display area DA. The sensing area SA may recognize various suitable information of a user. In an embodiment, the sensing area SA may recognize a fingerprint of the user. A planar shape of the sensing area SA may be a rectangular shape as illustrated in FIG. 1. However, the planar shape of the sensing area SA is not limited thereto.

For example, the sensing area SA may have various suitable planar shapes such as a circular shape, an oval shape, a polygonal shape, or the like.

The non-display area NDA may be disposed at (e.g., on) a periphery of the display area DA. The non-display area NDA may be around (e.g., may surround) the display area DA. The non-display area NDA may be an area that does not display an image (e.g., an area where an image is not to be displayed). In an embodiment, drivers for image display of the display area DA may be disposed in the non-display area NDA.

Figure 2:
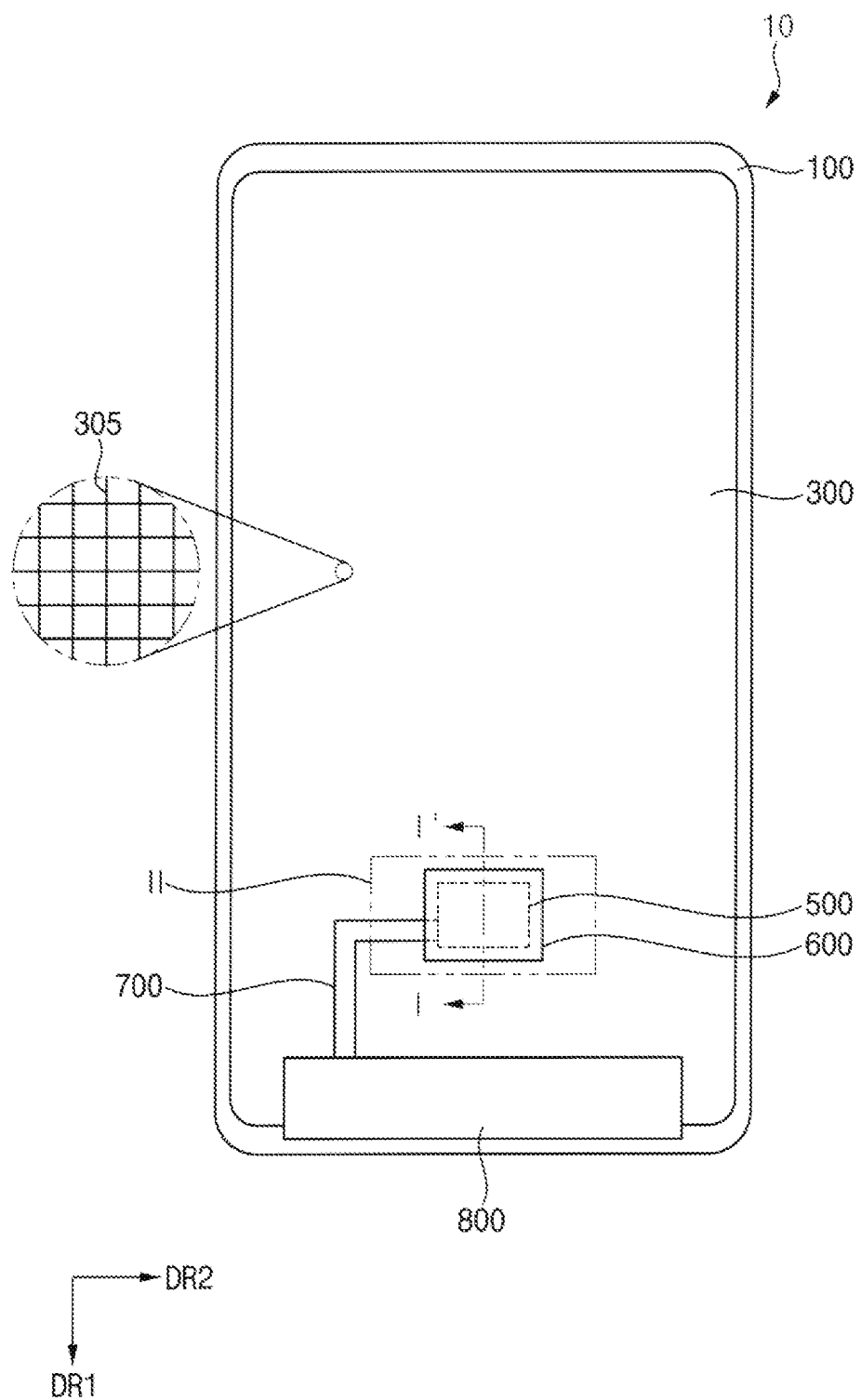
FIG. 2 is a rear view illustrating the display device in FIG. 1.
Figure 3:
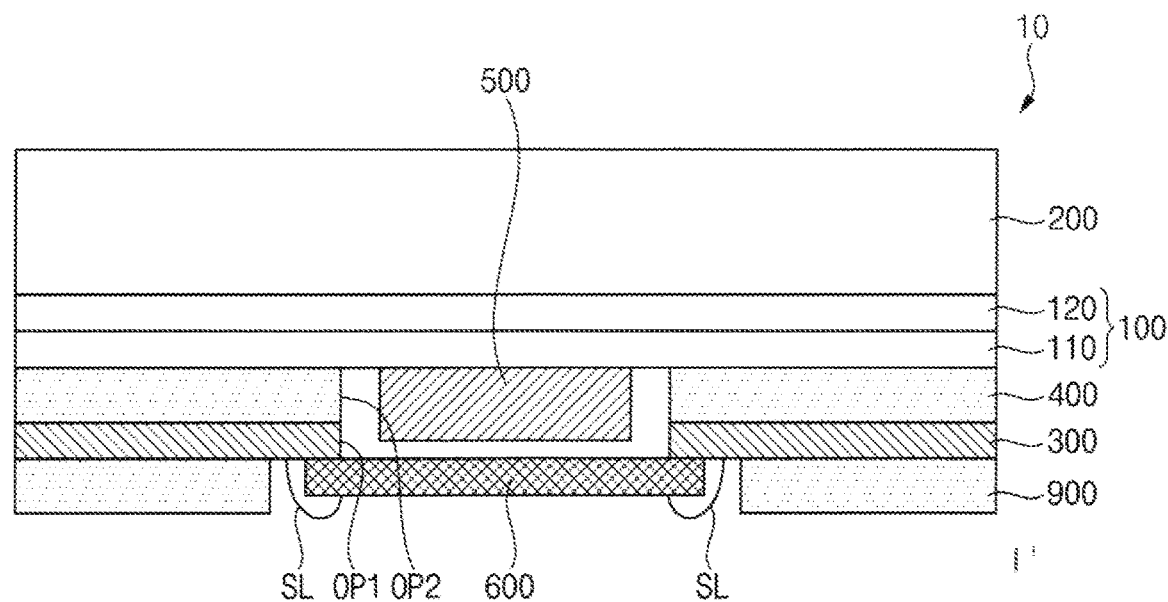
FIG. 3 is a cross-sectional view illustrating the display device taken along a line I-I' in FIG. 2.

FIG. 2 is a rear view illustrating the display device 10 in FIG. 1. FIG. 3 is a cross-sectional view illustrating the display device 10 taken along a line I-I' in FIG. 2.

Referring to FIGS. 1, 2, and 3, the display device 10 may include a display panel 100, a window 200, a digitizer 300, a cushion layer 400, a sensor 500, a first flexible circuit board 600, a second flexible circuit board 700, a driving circuit board 800, and a heat dissipation layer 900.

The display panel 100 may display an image. The display panel 100 may include a circuit element layer 110 and a display element layer 120.

The circuit element layer 110 may include a substrate and circuit elements disposed on the substrate. For example, the circuit elements may include a transistor, a capacitor, a wiring, and/or the like.

The substrate may be a rigid substrate including (e.g., being) a glass and/or the like, or a flexible substrate including (e.g., being) polyimide and/or the like. When the substrate is the flexible substrate, the display panel 100 may be bent (e.g., bendable), folded (e.g., foldable), and/or rolled (e.g., rollable).

The display element layer 120 may be disposed on the circuit element layer 110. The display element layer 120 may include display elements. For example, each of the display elements may be an organic light emitting element, but the present disclosure is not limited thereto.

The window 200 may be disposed on the display panel 100. The window 200 may protect the display panel 100, and may transmit light emitted from the display panel 100. Accordingly, the display device 10 may provide an image displayed in (e.g., displayed by) the display panel 100 to the user through the window 200. The window 200 may include (e.g., be) a glass and/or a plastic such as polyethylene terephthalate, polyvinyl resin, polyester, polyimide, and/or the like.

The window 200 may overlap the display panel 100 and may be disposed to cover an upper surface of the display panel 100. The window 200 may include a black matrix disposed along an edge (e.g., along a perimeter) of a lower surface of the window 200. The black matrix may prevent or block elements disposed under the window 200 from being recognized through an upper surface (or a display surface) of the display device 10.

In some embodiments, an input sensing layer and/or an anti-reflection layer may be disposed between the display panel 100 and the window 200. The input sensing layer may sense an external input such as an external object contacting, in close proximity with, and/or approaching the display device 10. The input sensing layer may be disposed on the upper surface of the display panel 100. The anti-reflection layer may reduce reflection of external light incident onto the display panel 100 through the window 200. In an embodiment, the anti-reflection layer may include a polarizing plate. In some embodiments, the anti-reflection layer may be disposed on an upper surface of the input sensing layer, but the present disclosure is not limited thereto. The input sensing layer and/or the anti-reflection layer may be combined to the display panel 100 and window 200 by an optically clear adhesive (OCA), an optically clear resin (OCR), and/or the like.

In some embodiments, the input sensing layer and/or the anti-reflection layer may be coupled (e.g., attached or secured) between the display panel 100 and the window 200 by the OCA, the OCR, and/or the like.

The digitizer 300 may be disposed on a lower surface of the display panel 100. The digitizer 300 may recognize movement of an input device (e.g., a stylus pen) on the upper surface of the display device 10, and may convert the movement into a digital signal.

The digitizer 300 may include a plurality of wirings 305 extending in a first direction DR1 and a second direction DR2 crossing the first direction DR1. For example, the plurality of wirings 305 may include a first plurality of wirings extending in the first direction DR1 and a second plurality of wirings extending in the second direction DR2 and crossing the first plurality of wirings. For example, the plurality of wirings 305 may have a mesh pattern. A magnetic field or an electric field emitted from the stylus pen may have an electromagnetic effect on the wirings 305, and accordingly, the digitizer 300 may detect which point of the digitizer 300 the stylus pen is close to. In some embodiments, the digitizer 300 may detect a position (e.g., a horizontal position) of the stylus pen. For example, the digitizer 300 may detect a point where two wirings from among the wirings 305 cross, the point corresponding to a horizontal position of the stylus pen. Further, the wirings 305 may generate a magnetic field and/or an electric field by electric current inputted to the wirings 305. The magnetic field and/or the electric field emitted from the wirings 305 may have an electromagnetic effect on the stylus pen, and accordingly, the digitizer 300 and the stylus pen may communicate with each other to perform various suitable input functions.

In an embodiment, the wirings 305 may include (e.g., be) metal, alloy, metal nitride, conductive metal oxide, a transparent conductive material, and/or the like. For example, the wirings 305 may include (e.g., be) at least one selected from gold (Au), silver (Ag), aluminum (Al), platinum (Pt), nickel (Ni), copper (Cu), titanium (Ti), palladium (Pd), magnesium (Mg), calcium (Ca), lithium (Li), chromium (Cr), tantalum (Ta), molybdenum (Mo), scandium (Sc), neodymium (Nd), Iridium (Ir), tungsten (W), tungsten nitride ($WN_x$), titanium nitride ($TiN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and alloy(s) thereof.

The digitizer 300 may have a first opening OP1. The first opening OP1 may overlap the sensing area SA. Accordingly, the first opening OP1 may be disposed in the display area DA in a plan view. Wirings overlapping the first opening OP1 among the wirings 305 may be disconnected at (e.g., by) the first opening OP1.

The cushion layer 400 may be disposed between the display panel 100 and the digitizer 300. The cushion layer 400 may alleviate impact applied to the display panel 100 from outside. The cushion layer 400 may be a foam shape or a gel shape. In some embodiments, the cushion layer 400 may include (e.g., be) foam and/or gel. The cushion layer 400 may include (e.g., be) polymer resin such as polyurethane (PU), polycarbonate (PC), polypropylene (PP) and/or the like, urethane foam, foam sponge, and/or the like.

The cushion layer 400 may have a second opening OP2. The second opening OP2 may overlap (e.g., overlap in the plan view) the first opening OP1. The lower surface of the display panel 100 may be exposed by the first opening OP1 and the second opening OP2.

The sensor 500 may be disposed under the display panel 100 in the first opening OP1 and the second opening OP2. In an embodiment, the sensor 500 may be a fingerprint recognition sensor utilizing (e.g., using) an infrared ray, an ultrasonic wave, and/or the like. However, the present disclosure is not limited thereto. For example, in some embodiments, the sensor 500 may be an iris recognition sensor, a proximity sensor and/or the like utilizing (e.g., using) an infrared ray, an ultrasonic wave, and/or the like.

In an embodiment, the sensor 500 may be spaced apart (e.g., spaced apart in the plan view) from an inner sidewall of the digitizer 300 and an inner sidewall of the cushion layer 400. In some embodiments, a size (e.g., planar area) of the first opening OP1 and a size (e.g., planar area) of the second opening OP2 may be greater than a size (e.g., planar area) of the sensor 500.

The first flexible circuit board 600 may be disposed under the sensor 500. The first flexible circuit board 600 may contact (e.g., physically contact) a lower surface of the digitizer 300 and may cover the sensor 500. Accordingly, a size (e.g., planar area) of the first flexible circuit board 600 may be greater than the size of the first opening OP1.

The first flexible circuit board 600 may electrically couple (e.g., connect) the wirings 305 of the digitizer 300 disconnected by the first opening OP1. The first flexible circuit board 600 will be described with reference to FIGS. 4 to 8 in more detail below.

The driving circuit board 800 may be coupled (e.g., connected) to the display panel 100. A driving chip for driving the display panel 100 may be disposed on the driving circuit board 800, and the driving circuit board 800 may electrically couple (e.g., connect) the driving chip and the display panel 100.

The second flexible circuit board 700 may couple (e.g., connect) the sensor 500 and the driving circuit board 800. The second flexible circuit board 700 may extend from a side of the sensor 500 to be coupled (e.g., connected) to the driving circuit board 800. The second flexible circuit board 700 may transmit a sensing signal generated from the sensor 500 to the driving circuit board 800.

The heat dissipation layer 900 may be disposed under the digitizer 300. The heat dissipation layer 900 may block noise generated from the display panel 100 and may dissipate heat generated from the display panel 100. The heat dissipation layer 900 may include (e.g., be) metal, such as copper (Cu), aluminum (Al) and/or the like, graphite, carbon nanotube, heat pipe, and/or the like.

Figure 4:
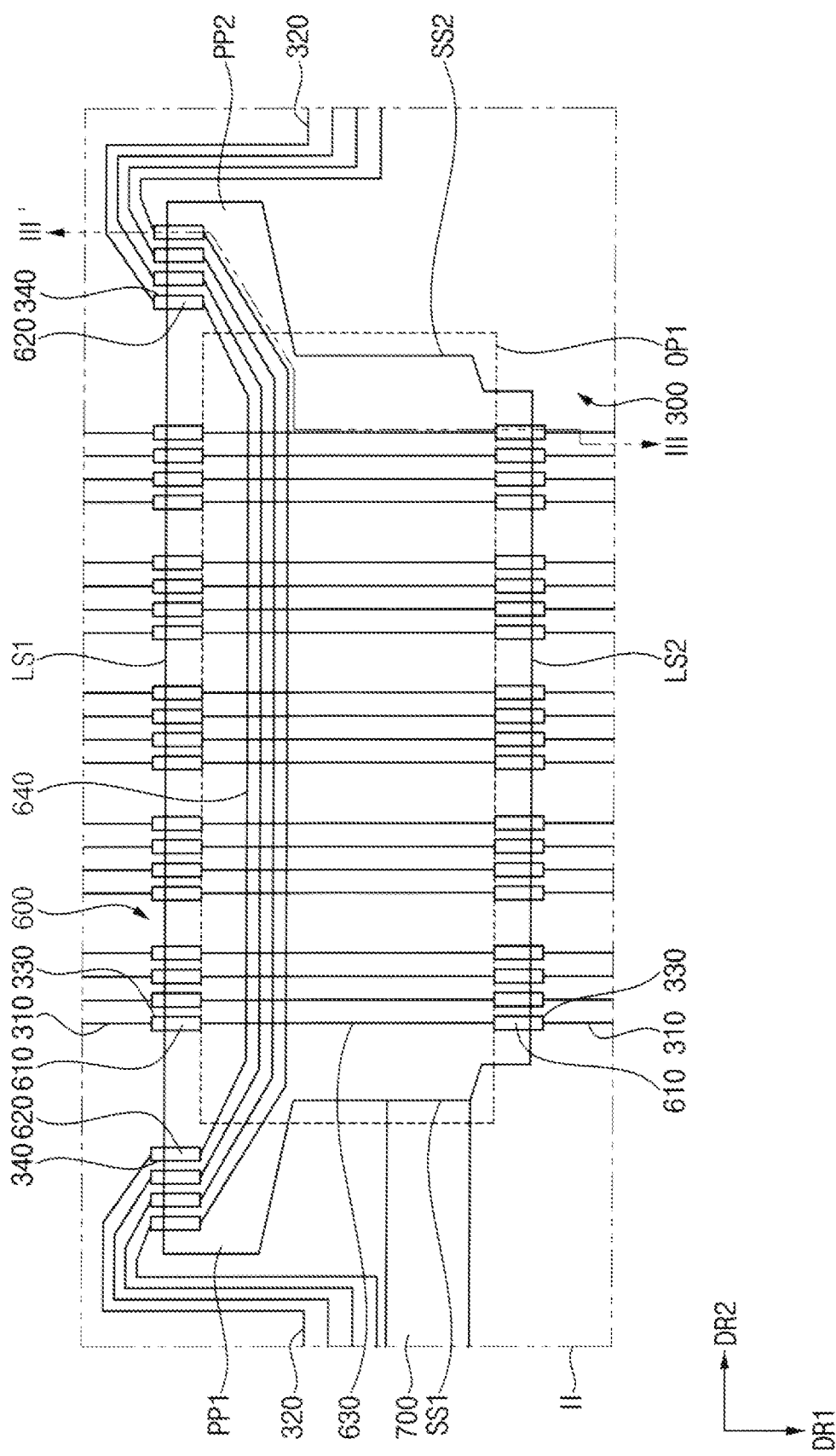
FIG. 4 is a plan view illustrating an example of an area II in FIG. 2 according to an embodiment.
Figure 5:
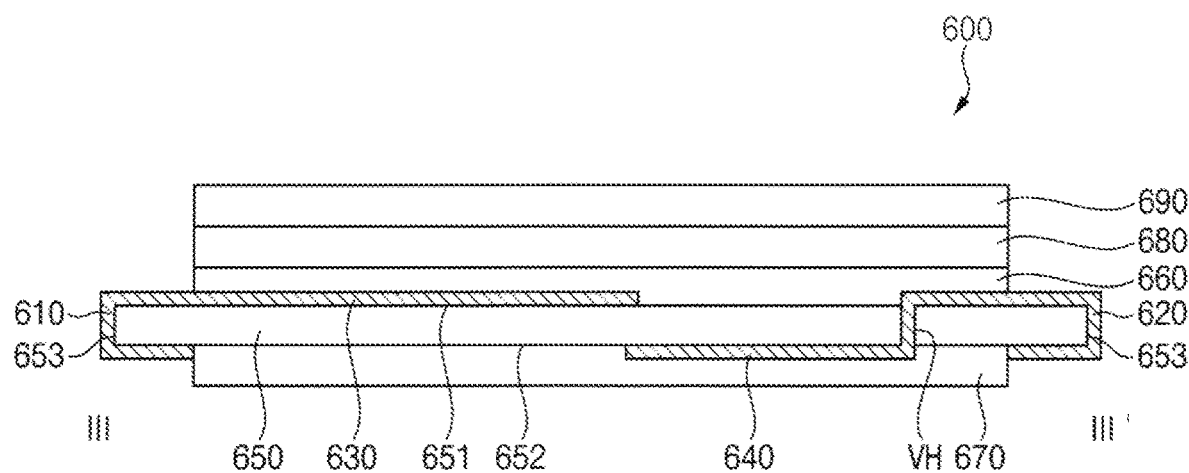
FIG. 5 is a cross-sectional view illustrating a first flexible circuit board taken along a line III-III' in FIG. 4.

FIG. 4 is a plan view illustrating an example of an area II in FIG. 2 according to an embodiment. FIG. 5 is a cross-sectional view illustrating the first flexible circuit board 600 taken along a line III-III' in FIG. 4.

Referring to FIGS. 2, 3, 4, and 5, the digitizer 300 may include a plurality of first wirings 310 extending in the first direction DR1 and disconnected at (e.g., by) the first opening OP1 and a plurality of second wirings 320 extending in the second direction DR2 and disconnected by the first opening OP1. For example, each of the first wirings 310 and the second wirings 320 may have a gap in the wiring at (e.g., corresponding to) the first opening OP1. The digitizer 300 may include the first opening OP1 in which the sensor 500 is disposed, and accordingly, the first wirings 310 and the second wirings 320 may be disconnected by the first opening OP1.

In an embodiment, the digitizer 300 may include a plurality of first pads 330 respectively disposed at (e.g., on) ends of the first wirings 310 at (e.g., adjacent to) the first opening OP1 and a plurality of second pads 340 respectively disposed at (e.g., on) ends of the second wirings 320 at (e.g., adjacent to) the first opening OP1. The first pads 330 may be respectively coupled (e.g., connected) to first connection pads 610 of the first flexible circuit board 600, and the second pads 340 may be respectively coupled (e.g., connected) to second connection pads 620 of the first flexible circuit board 600. Accordingly, the first wirings 310 may be respectively electrically coupled (e.g., connected) to the first connection pads 610 of the first flexible circuit board 600, and the second wirings 320 may be respectively electrically coupled (e.g., connected) to the second connection pads 620 of the first flexible circuit board 600.

The first flexible circuit board 600 may be disposed under the sensor 500, and may cover (e.g., entirely cover) the first opening OP1. The first flexible circuit board 600 may include a first long side LS1 extending in the second direction DR2, a second long side LS2 parallel (e.g., substantially parallel) to the first long side LS1, a first short side SS1 coupling (e.g., connecting) an end of the first long side LS1 and an end of the second long side LS2, and a second short side SS2 coupling (e.g., connecting) another end of the first long side LS1 and another end of the second long side LS2. For example, the second long side LS2 may be positioned (e.g., spaced apart) in the first direction DR1 from the first long side LS1, and the second short side SS2 may be positioned (e.g., spaced apart) in the second direction DR2 from the first short side SS1.

The first flexible circuit board 600 may include a plurality of first connection pads 610, a plurality of second connection pads 620, a plurality of first connection wirings 630, a plurality of second connection wirings 640, a first insulation layer 650, a second insulation layer 660, a third insulation layer 670, an anti-electromagnetic layer 680, and a fourth insulation layer 690.

In an embodiment, the first connection pads 610, the second connection pads 620, the first connection wirings 630, and the second connection wirings 640 may include (e.g., be) metal, alloy, metal nitride, conductive metal oxide, a transparent conductive material, and/or the like. For example, the first connection pads 610, the second connection pads 620, the first connection wirings 630, and the second connection wirings 640 may each include (e.g., be) at least one selected from gold (Au), silver (Ag), aluminum (Al), platinum (Pt), nickel (Ni), copper (Cu), titanium (Ti), palladium (Pd), magnesium (Mg), calcium (Ca), lithium (Li), chromium (Cr), tantalum (Ta), molybdenum (Mo), scandium (Sc), neodymium (Nd), Iridium (Ir), tungsten (W), tungsten nitride ($WN_x$), titanium nitride ($TiN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and alloy thereof. In an embodiment, the first connection pads 610, the second connection pads 620, the first connection wirings 630, and the second connection wirings 640 may each be formed as a multilayer structure including (e.g., being) one or more selected from the materials described above.

The first connection pads 610 may be disposed on the first long side LS1 and the second long side LS2. A pair of first connection pads 610 may be respectively disposed on the first long side LS1 and the second long side LS2, and a plurality of pairs of the first connection pads 610 may be arranged with each other along the second direction DR2. A pair of first connection pads 610 may refer to a pair of connection pads from among the first connection pads 610 that are coupled (e.g., connected) through a first connection wiring 630.

The first connection pads 610 may respectively contact (e.g., physically contact) the first pads 330 of the digitizer 300. The first connection pads 610 may correspond to the first pads 330 in one-to-one correspondence. Accordingly, the first connection pads 610 may be respectively electrically coupled (e.g., connected) to the first wirings 310 of the digitizer 300.

Solders SL may be disposed under the first connection pads 610 and the first pads 330 that respectively contact the first connection pads 610. The solders SL may fix and electrically couple (e.g., connect) the first connection pads 610 and the first pads 330 that respectively contact the first connection pads 610.

Each of the first connection wirings 630 may couple (e.g., connect) a respective pair of the first connection pads 610. Accordingly, the pair of the first connection pads 610 may be electrically coupled (e.g., connected) to each other by the respective first connection wiring 630. In an embodiment, the first connection wirings 630 may extend in the first direction DR1.

The first pads 330 of the digitizer 300 may contact the first connection pads 610 of the first flexible circuit board 600, and the first connection pads 610 may be electrically coupled (e.g., connected) to each other by the first connection wirings 630, so that the first wirings 310 of the digitizer 300 physically disconnected by the first opening OP1 may be electrically coupled (e.g., connected). Accordingly, the first flexible circuit board 600 may serve to electrically coupled (e.g., connect) the first wirings 310 of the digitizer 300 disconnected by the first opening OP1.

The second connection pads 620 may be disposed on the first long side LS1. The second connection pads 620 may be disposed adjacent to opposite ends of the first long side LS1. For example, a first set of connection pads from among the second connection pads 620 may be at one end of the first long side LS1, and a second set of connection pads from among the second connection pads 620 may be at another end of the first long side LS1 opposite to the one end of the first long side LS1. In some embodiments, the first connection pads 610 disposed at (e.g., on) the first long side LS1 may be between the first set of connection pads from among the second connection pads 620 and the second set of connection pads from among the second connection pads 620.

In an embodiment, the first flexible circuit board 600 may include a first protruding portion PP1 protruding in an opposite direction to the second direction DR2 between the first long side LS1 and the first short side SS1 and a second protruding portion PP2 protruding in the second direction DR2 between the first long side LS1 and the second short side SS2. In such an embodiment, a length of the first long side LS1 in the second direction DR2 may be greater than a length of the second long side LS2 in the second direction DR2. In some embodiments, the first long side LS1 may include a side of each of the first protruding portion PP1 and the second protruding portion PP2. FIG. 4 illustrates that each of the first protruding portion PP1 and the second protruding portion PP2 has a planar trapezoid shape, however, the present disclosure is not limited thereto. For example, each of the first protruding portion PP1 and the second protruding portion PP2 may have various suitable planar polygonal shapes. A pair of second connection pads 620 may be respectively disposed at (e.g., on) the first protruding portion PP1 and the second protruding portion PP2, and a plurality of pairs of the second connection pads 620 may be arranged with each other along the second direction DR2. A pair of second connection pads 620 may refer to a pair of connection pads from among the second connection pads 620 that are coupled (e.g., connected) by a respective second connection wiring 640. One connection pad from among a pair of second connection pads 620 may be at (e.g., on) the first protruding portion PP1, and another connection pad from among the pair of second connection pads 620 may be at (e.g., on) the second protruding portion PP2. In this case, the first connection pads 610 disposed on the first long side LS1 may be disposed between the pair of the second connection pads 620. For example, the first connection pads 610 disposed on the first long side LS1 may be disposed between connection pads of the pair of the second connection pads 620.

The second connection pads 620 may respectively contact (e.g., physically contact) the second pads 340 of the digitizer 300. The second connection pads 620 may correspond to the second pads 340 in one-to-one correspondence. Accordingly, the second connection pads 620 may be respectively electrically coupled (e.g., connected) to the second wirings 320 of the digitizer 300.

Solders SL may be disposed under the second connection pads 620 and the second pads 340 that contact the second connection pads 620. The solders SL may fix and electrically couple (e.g., connect) the second connection pads 620 and the second pads 340 that contact the second connection pads 620.

Each of the second connection wirings 640 may couple (e.g., connect) a respective pair of the second connection pads 620. Accordingly, the pair of the second connection pads 620 may be electrically coupled (e.g., connected) to each other by the respective second connection wiring 640.

The second connection wirings 640 may be insulated from the first connection wirings 630. The first insulation layer 650 may be interposed between the first connection wirings 630 and the second connection wirings 640. The first connection wirings 630 may be disposed on a first surface 651 of the first insulation layer 650, and the second connection wirings 640 may be disposed on a second surface 652 of the first insulation layer 650 opposite to the first surface 651.

In an embodiment, the first connection pads 610 and the second connection pads 620 may each be disposed on the first surface 651, the second surface 652, and a side surface 653 of the first insulation layer 650. In some embodiments, the first connection pads 610 and the second connection pads 620 may cover the first long side LS1 or the second long side LS2 of the first flexible circuit board 600, and may be disposed on the first surface 651, the second surface 652, and a side surface 653 of the first insulation layer 650.

In an embodiment, the first connection wiring 630 may be coupled (e.g., connected) to a portion of the first connection pad 610 disposed on the first surface 651 of the first insulation layer 650, and the second connection wiring 640 may be coupled (e.g., connected) to a portion of the second connection pad 620 disposed on the first surface 651 of the first insulation layer 650. In such an embodiment, the second connection wiring 640 disposed on the second surface 652 of the first insulation layer 650 may be coupled (e.g., connected) to the portion of the second connection pad 620 disposed on the first surface 651 of the first insulation layer 650 through via holes VH passing through the first insulation layer 650.

The second insulation layer 660 may be disposed on the first surface 651 of the first insulation layer 650, and may cover the first connection wirings 630. The second insulation layer 660 may expose the first connection pads 610 and the second connection pads 620. The second insulation layer 660 may include (e.g., be) polyimide (PI) and/or the like.

The third insulation layer 670 may be disposed on the second surface 652 of the first insulation layer 650, and may cover the second connection wirings 640. The third insulation layer 670 may expose the first connection pads 610 and the second connection pads 620. The third insulation layer 670 may include coverlay and/or the like.

In some embodiments, the third insulation layer 670 may include (e.g., be) polyimide and/or the like. In some embodiments, the third insulation layer 670 may include an adhesive (e.g., an epoxy or acrylic based adhesive) layer on the second surface 652 of the first insulation layer 650 and a polyimide layer on the adhesive layer.

The anti-electromagnetic layer 680 may be disposed on the second insulation layer 660. The anti-electromagnetic layer 680 may block electrical or magnetic interference between the sensor 500 and the first flexible circuit board 600 that overlap each other.

The fourth insulation layer 690 may be disposed on the anti-electromagnetic layer 680. The fourth insulation layer 690 may include (e.g., be) polyimide (PI) and/or the like.

In an embodiment, the second connection wirings 640 may have a shape bent at least once in a plan view. Because the first connection pads 610 are disposed between the pair of the second connection pads 620, the second connection wiring 640 coupling (e.g., connecting) the pair of the second connection pads 620 may be bent at least once to bypass the first connection pads 610. FIG. 4 illustrates that the second connection wiring 640 has a shape bent twice in a plan view, however, the present disclosure is not limited thereto. For example, the second connection wiring 640 may be bent once or three or more times in the plan view.

The second pads 340 of the digitizer 300 may contact the second connection pads 620 of the first flexible circuit board 600, and the second connection pads 620 may be electrically coupled (e.g., connected) to each other by the second connection wirings 640, so that the second wirings 320 of the digitizer 300 physically disconnected by the first opening OP1 may be electrically coupled (e.g., connected). Accordingly, the first flexible circuit board 600 may serve to electrically couple (e.g., connect) the second wirings 320 of the digitizer 300 disconnected by the first opening OP1.

The second flexible circuit board 700 coupled (e.g., connected) to the sensor 500 may extend from the inside of the first opening OP1 to the outside of the first opening OP1 through a space between the digitizer 300 and the first flexible circuit board 600. In an embodiment, the second flexible circuit board 700 may extend from the inside of the first opening OP1 to the outside of the first opening OP1 through a space between the digitizer 300 and the first short side SS1 of the first flexible circuit board 600. In such an embodiment, the second flexible circuit board 700 may overlap (e.g., overlap in the plan view) the first short side SS1.

In an embodiment, the second flexible circuit board 700 may be spaced apart from the first protruding portion PP1 in the first direction DR1. For example, a gap may be formed between the first protruding portion PP1 and the second flexible circuit board 700.

In a display device according to the related art, the second connection pads 620 of the first flexible circuit board 600 may be disposed on the first short side SS1 and the second short side SS2. A pair of the second connection pads 620 may be respectively disposed on the first short side SS1 and the second short side SS2, and a plurality of the pairs of the second connection pads 620 may be arranged with each other along the first direction DR1. In the display device according to the related art, when the first flexible circuit board 600 moves in the second direction DR2 to align the first flexible circuit board 600 to the digitizer 300 in the second direction DR2, misalignment between the first pads 330 of the digitizer 300 and the first connection pads 610 of the first flexible circuit board 600 may occur. Further, in the display device according to the related art, when the first flexible circuit board 600 moves in the first direction DR1 to align the first flexible circuit board 600 to the digitizer 300 in the first direction DR1, misalignment between the second pads 340 of the digitizer 300 and the second connection pads 620 of the first flexible circuit board 600 may occur. Further, in the display device according to the related art, interference between the second connection pads 620 of the first flexible circuit board 600 disposed on the first short side SS1 and the second flexible circuit board 700 overlapping the first short side SS1 may occur. Accordingly, the first flexible circuit board 600 may be detached from the digitizer 300.

However, in the display device according to embodiments of the present disclosure, the second connection pads 620 of the first flexible circuit board 600 may be disposed on the first long side LS1, so that misalignment between the digitizer 300 and the first flexible circuit board 600 may be prevented or reduced. Although the first flexible circuit board 600 may move in the first direction DR1 to align the first flexible circuit board 600 to the digitizer 300 in the first direction DR1, misalignment between the second pads 340 of the digitizer 300 and the second connection pads 620 of the first flexible circuit board 600 may not occur because the second connection pads 620 are not disposed on the first and second short sides SS1 and SS2. Further, interference between the second connection pads 620 of the first flexible circuit board 600 and the second flexible circuit board 700 may be prevented or reduced, and accordingly, the first flexible circuit board 600 may not be detached from the digitizer 300.

Figure 6:
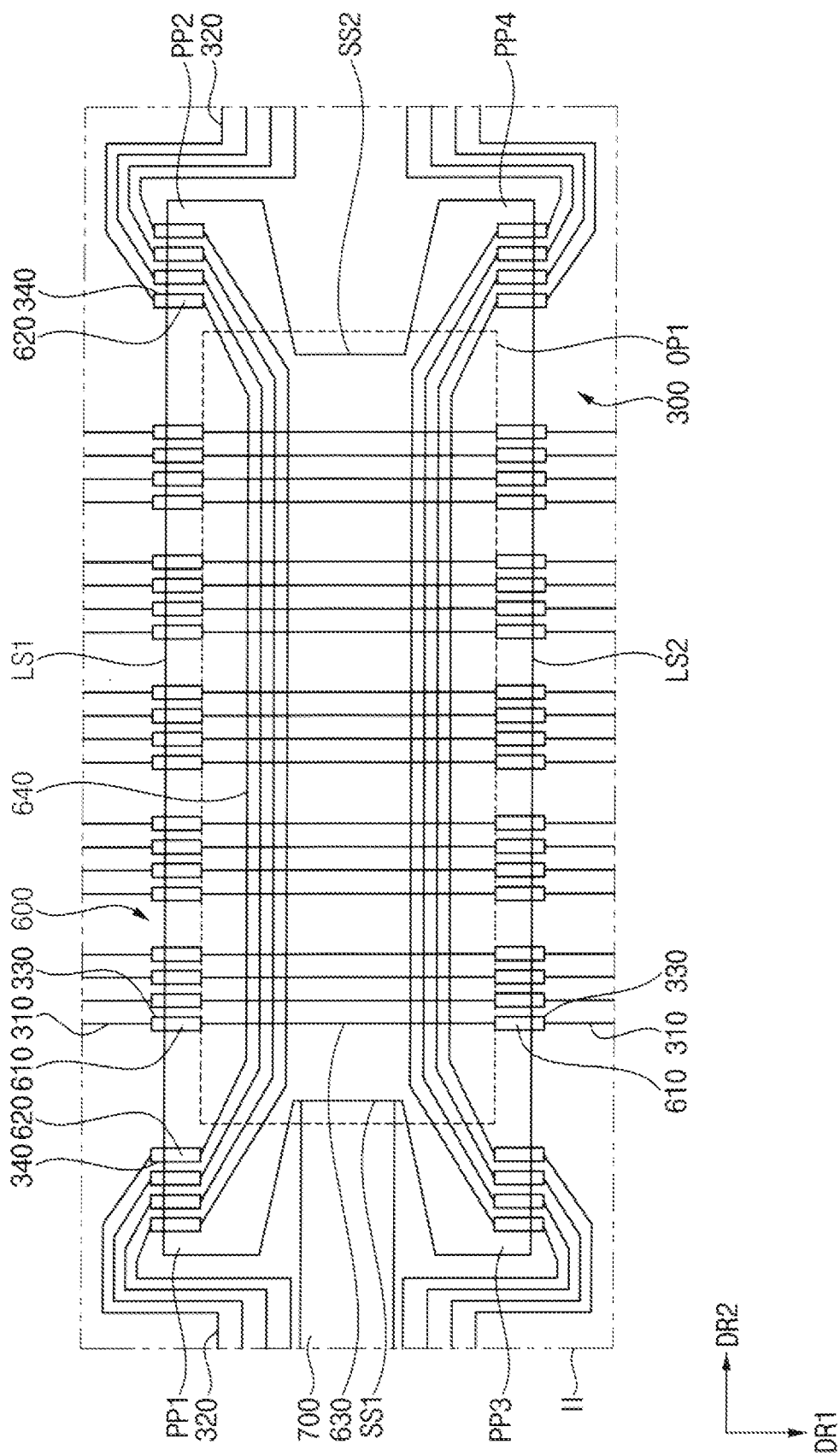
FIG. 6 is a plan view illustrating an example of the area II in FIG. 2 according to an embodiment.

FIG. 6 is a plan view illustrating an example of the area II in FIG. 2 according to an embodiment.

Descriptions of elements in an embodiment described with reference to FIG. 6 that are substantially the same as or similar to those in the embodiment described with reference to FIG. 4 may not be repeated.

Referring to FIGS. 2 and 6, the second connection pads 620 may be disposed on the first long side LS1 and the second long side LS2. The second connection pads 620 may be disposed adjacent to opposite ends of the first long sides LS1 and opposite ends of the second long sides LS2.

In an embodiment, the first flexible circuit board 600 may further include a third protruding portion PP3 protruding in an opposite direction to the second direction DR2 between the second long side LS2 and the first short side SS1 and a fourth protruding portion PP4 protruding in the second direction DR2 between the second long side LS2 and the second short side SS2. In such an embodiment, a length of the first long side LS1 in the second direction DR2 may be substantially equal to a length of the second long side LS2 in the second direction DR2. In some embodiments, the second long side LS2 may include a side of each of the third protruding portion PP3 and the fourth protruding portion PP4. FIG. 6 illustrates that each of the third protruding portion PP3 and the fourth protruding portion PP4 has a planar trapezoid shape, however, the present disclosure is not limited thereto. For example, each of the third protruding portion PP3 and the fourth protruding portion PP4 may have various suitable planar polygonal shapes.

In an embodiment, a pair of second connection pads 620 may be respectively disposed at (e.g., on) the third protruding portion PP3 and the fourth protruding portion PP4, and a plurality of pairs of the second connection pads 620 may be arranged with each other along the second direction DR2. In such an embodiment, the first connection pads 610 disposed on the second long side LS2 may be disposed between the pair of the second connection pads 620.

In the embodiments described with reference to FIG. 6, the second connection pads 620 may be disposed on the first long side LS1 and the second long side LS2, so that the first flexible circuit board 600 may couple (e.g., connect) a relatively large number of the second wirings 320 of the digitizer 300. Accordingly, the second wirings 320 of the digitizer 300 disconnected by the first opening OP1 may be coupled (e.g., connected) by the first flexible circuit board 600 although the size of the first opening OP1 increases, and the size of the sensing area SA in FIG. 1 of the display device may increase.

Figure 7:
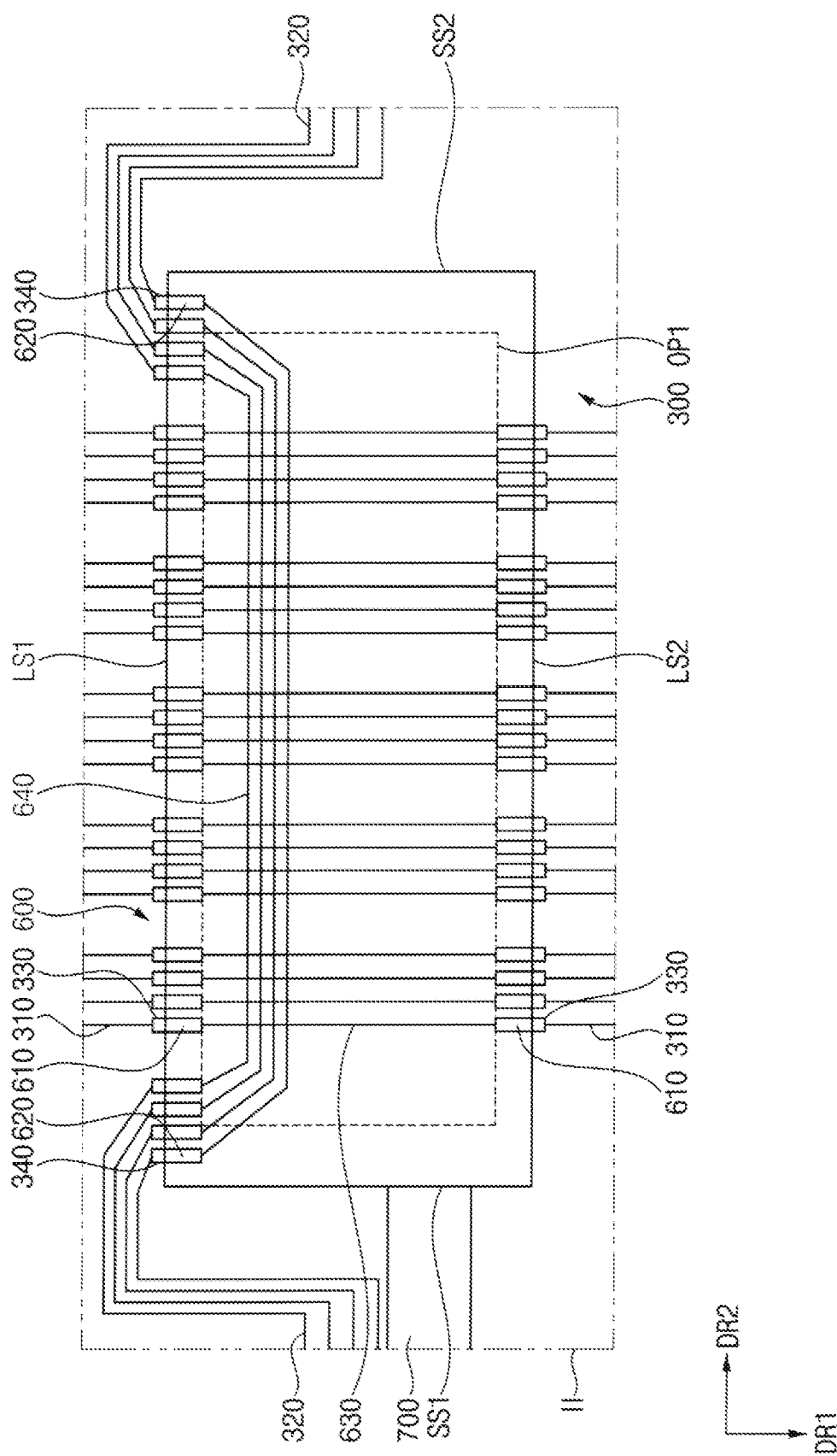
FIG. 7 is a plan view illustrating an example of the area II in FIG. 2 according to an embodiment.

FIG. 7 is a plan view illustrating an example of the area II in FIG. 2 according to an embodiment.

Descriptions of elements in an embodiment described with reference to FIG. 7 that are substantially the same as or similar to those in the embodiment described with reference to FIG. 4 may not be repeated.

Referring to FIG. 7, in an embodiment, the first short side SS1 may extend in the first direction DR1, and the second short side SS2 may be parallel (e.g., substantially parallel) to the first short side SS1. In such an embodiment, the first flexible circuit board 600 may have a planar rectangular shape.

In an embodiment, the second connection pads 620 may be closer to a first corner of the first flexible circuit board 600 in which the first long side LS1 contacts or crosses the first short side SS1 or to a second corner of the first flexible circuit board 600 in which the first long side LS1 contacts or crosses the second short side SS2 than the first connection pads 610 disposed on the first long side LS1. For example, one of the pair of the second connection pads 620 may be closer to the first corner than the first connection pads 610 disposed on the first long side LS1, and the other of the pair of the second connection pads 620 may be closer to the second corner than the first connection pads 610 disposed on the first long side LS1.

FIG. 8 is a plan view illustrating an example of the area II in FIG. 2 according to an embodiment.

Descriptions of elements in an embodiment described with reference to FIG. 8 that are substantially the same as or similar to those in the embodiment described with reference to FIG. 7 may not be repeated.

Referring to FIG. 8, the second connection pads 620 may be disposed on the first long side LS1 and the second long side LS2. The second connection pads 620 may be disposed adjacent to opposite ends of the first long side LS1 and opposite ends of the second long side LS2.

In an embodiment, the second connection pads 620 disposed on the second long side LS2 may be closer to a third corner of the first flexible circuit board 600 in which the second long side LS2 contacts or crosses the first short side SS1 or a fourth corner of the first flexible circuit board 600 in which the second long side LS2 contacts or crosses the second short side SS2 than the first connection pads 610 disposed on the second long side LS2. For example, one of the pair of the second connection pads 620 disposed on the second long side LS2 may be closer to the third corner than the first connection pads 610 disposed on the second long side LS2, and the other of the pair of the second connection pads 620 disposed on the second long side LS2 may be closer to the fourth corner than the first connection pads 610 disposed on the second long side LS2.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be suitably modified and changed by a person having ordinary knowledge in the relevant technical field without departing from the technical spirit described in the following claims and equivalents thereof.

What is claimed is:

1. A display device, comprising:
   a display panel comprising a display area and a non-display area in a periphery of the display area;
   a digitizer under the display panel, the digitizer having a first opening and comprising a first wiring extending in a first direction and disconnected at the first opening and a second wiring extending in a second direction crossing the first direction and disconnected at the first opening;
   a sensor under the display panel and in the first opening; and
   a first flexible circuit board under the sensor, the first flexible circuit board comprising a long side extending in the second direction, a short side crossing the long side, a first connection pad on the long side and electrically coupled to the first wiring, and a second connection pad on the long side and electrically coupled to the second wiring.

2. The display device of claim 1, wherein the first flexible circuit board further comprises a protruding portion between the long side and the short side and extending in the second direction.

3. The display device of claim 2, wherein the second connection pad is on the long side at the protruding portion.

4. The display device of claim 2, further comprising:
   a second flexible circuit board coupled to the sensor and overlapping the short side.

5. The display device of claim 4, wherein the second flexible circuit board is spaced apart from the protruding portion in the first direction.

6. The display device of claim 1, wherein the short side extends in the first direction.

7. The display device of claim 6, wherein the second connection pad is closer to a corner of the first flexible circuit board in which the long side contacts the short side than the first connection pad is to the corner.

8. The display device of claim 1, wherein the first opening is in the display area in a plan view.

9. The display device of claim 1, wherein the sensor is a fingerprint recognition sensor.

10. The display device of claim 1, further comprising:
    a cushion layer between the display panel and the digitizer and having a second opening overlapping the first opening.

11. A display device, comprising:
    a display panel comprising a display area and a non-display area in a periphery of the display area;
    a digitizer under the display panel, the digitizer having an opening in the display area in a plan view and comprising a first wiring extending in a first direction and disconnected at the opening and a second wiring extending in a second direction crossing the first direction and disconnected at the opening;

a sensor under the display panel and in the opening; and a first flexible circuit board under the sensor, the first flexible circuit board comprising a first long side extending in the second direction, a second long side parallel to the first long side, a short side coupling the first long side and the second long side, a pair of first connection pads respectively on the first long side and the second long side and electrically coupled to the first wiring, and a pair of second connection pads on the first long side and electrically coupled to the second wiring.

12. The display device of claim 11, wherein a first connection pad on the first long side among the pair of first connection pads is between the pair of second connection pads.

13. The display device of claim 11, wherein the first flexible circuit board further comprises a first connection wiring coupling the pair of first connection pads and a second connection wiring insulated from the first connection wiring and coupling the pair of second connection pads.

14. The display device of claim 13, wherein the first connection wiring extends in the first direction.

15. The display device of claim 13, wherein the second connection wiring is bent at least once in the plan view.

16. The display device of claim 11, wherein the first long side is greater than the second long side in length.

17. The display device of claim 11, wherein the first long side is equal to the second long side in length.

18. The display device of claim 11, further comprising:
a second flexible circuit board coupled to the sensor and overlapping the short side.

19. A display device, comprising:
a display panel comprising a display area and a non-display area in a periphery of the display area;
a digitizer under the display panel, the digitizer having an opening in the display area in a plan view and comprising a plurality of first wirings extending in a first direction and disconnected at the opening and a plurality of second wirings extending in a second direction crossing the first direction and disconnected at the opening;
a sensor under the display panel and in the opening; and
a flexible circuit board under the sensor, the flexible circuit board comprising a first long side extending in the second direction, a second long side parallel to the first long side, a short side coupling the first long side and the second long side, a plurality of first connection pads on the first long side and the second long side and electrically coupled to the first wirings, and a plurality of second connection pads on at least one selected from the first long side and the second long side and electrically coupled to the second wirings.

20. The display device of claim 19, wherein the second connection pads are on the first long side and the second long side.

* * * * *